US011735456B2

(12) United States Patent
Lin et al.

(10) Patent No.: US 11,735,456 B2
(45) Date of Patent: Aug. 22, 2023

(54) ALIGNMENT MECHANISM AND ALIGNMENT METHOD OF BONDING MACHINE

(71) Applicant: SKY TECH INC., Hsinchu County (TW)

(72) Inventors: Jing-Cheng Lin, Hsinchu County (TW); Jung-Hua Chang, Hsinchu County (TW); Mao-chan Chang, Hsinchu County (TW)

(73) Assignee: SKY TECH INC., Hsinchu County (TW)

( * ) Notice: Subject to any disclaimer, the term of this patent is extended or adjusted under 35 U.S.C. 154(b) by 224 days.

(21) Appl. No.: 17/199,369

(22) Filed: Mar. 11, 2021

(65) Prior Publication Data
US 2022/0122868 A1 Apr. 21, 2022

(30) Foreign Application Priority Data
Oct. 16, 2020 (TW) .................................. 109135987

(51) Int. Cl.
*H01L 21/68* (2006.01)
*H01L 21/687* (2006.01)
*H01L 21/683* (2006.01)

(52) U.S. Cl.
CPC ........ *H01L 21/68* (2013.01); *H01L 21/68728* (2013.01); *H01L 21/68742* (2013.01); *H01L 21/6835* (2013.01)

(58) Field of Classification Search
CPC ..... B25B 11/00; H01L 21/68; H01L 21/6835; H01L 21/68742; H01L 21/6875; H01L 21/68771; H01L 21/68728

USPC ... 269/43, 45, 113, 111, 117, 138, 139, 143, 269/229
See application file for complete search history.

(56) References Cited

U.S. PATENT DOCUMENTS 6,485,248 B1 * 11/2002 Taylor, Jr. .......... H01L 21/68742
414/217

FOREIGN PATENT DOCUMENTS

CN 111916384 A * 11/2020 ........ H01L 21/67011

OTHER PUBLICATIONS

CN-111916384-A Description (Year: 2020).*

* cited by examiner

*Primary Examiner* — Lee D Wilson
*Assistant Examiner* — Abbie E Quann
(74) *Attorney, Agent, or Firm* — Chun-Ming Shih; HDLS IPR Services

(57) ABSTRACT

The present disclosure is an alignment mechanism of a bonding machine, in particular an alignment mechanism of a wafer bonding machine, which mainly has a support pedestal, at least three first alignment pins, and at least three second alignment pins, a first cam and a second cam. When the first cam rotates relative to the support pedestal, it will drive the first alignment pin to move relative to the support pedestal to position the first substrate on the support pedestal. When the second cam rotates relative to the support pedestal, it drives the second alignment pin to move relative to the support pedestal to position the second substrate above the first substrate, so that the second substrate is aligned with the first substrate to facilitate bonding the first substrate and the second substrate.

13 Claims, 11 Drawing Sheets

ALIGNMENT MECHANISM AND ALIGNMENT METHOD OF BONDING MACHINE

BACKGROUND

1. Technical Field

The present disclosure relates to an alignment mechanism of a bonding machine and alignment method, and in particular, to a wafer alignment mechanism of the bonding machine and an alignment method, which can quickly and accurately align a wafer and a substrate to facilitate subsequent bonding of the wafer and the substrate.

2. Description of Related Art

With the advancement of semiconductor technology, the thickness of wafers is continuously reduced to facilitate subsequent wafer cutting and packaging processes. In addition, the thinning of the wafer is also conducive to chip size reduction, resistance reduction, calculating speed acceleration and lifetime extension. However, the structure of the thinned wafer is very fragile, and the wafer is prone to warp or break in the subsequent manufacturing process, thereby reducing the yield rate of the product.

In order to avoid the above-mentioned problems, it is generally selected to temporarily bond the wafer to the carrier substrate, and support the thinned wafer through the carrier substrate to avoid warping or fracture situation of the thinned wafer during the manufacturing process.

Specifically, an adhesive can be applied to the surface of the carrier substrate and the wafer, and then the carrier substrate and the wafer are moved to a bonding machine for alignment, and the temperatures of the carrier substrate and the wafer are increased for bonding. After the bonding is completed, the wafer can be thinned, etched, and metalized, and finally the wafer and the carrier substrate can be peeled off from each other.

Although the bonding of the wafer and the carrier substrate can be completed through the above-mentioned steps, the general alignment mechanism of the bonding machine still has the problems of poor accuracy and low alignment efficiency, which cause a certain impact on the efficiency and yield rate of the process.

SUMMARY

In order to solve the above problems, the present disclosure proposes an alignment mechanism of the bonding machine and alignment method, which can effectively improve the accuracy and efficiency of the alignment between the wafer and the carrier substrate, thereby helping to improve the efficiency and yield rate of the process. In addition, through the alignment mechanism of the present disclosure, the cost of installing multiple detectors on the machine can also be saved.

An objective of the present disclosure is to provide an alignment mechanism of a bonding machine, which mainly uses cams to drive alignment pins to position the wafer and the carrier substrate, which can quickly and accurately complete the alignment and bonding of the wafer and the carrier substrate.

An objective of the present disclosure is to provide an alignment mechanism of a bonding machine, wherein the first cam and the second cam can respectively drive the first alignment pins and the second alignment pins to move/ displace relative to the support pedestal between an open state and an alignment state. When operating in the open state, a distance between the first alignment pins and a distance between the second alignment pins are larger or largest, and the first substrate and the second substrate are placed respectively between the first alignment pins and between the second alignment pins. When operating in the alignment state, the distance between the first alignment pins and the distance between the second alignment pins are smaller or smallest. When the first alignment pins and the second alignment pins switch from the open state to the alignment state, the first alignment pins and the second alignment pins respectively contact and push the first substrate and the second substrate, and respectively position the first substrate and the second substrate, so that the first substrate is aligned with the second substrate, which facilitates sequent bonding of the first substrate and the second substrate.

An objective of the present disclosure is to provide an alignment mechanism of a bonding machine comprising a support pedestal, at least three first alignment pins, at least three second alignment pins, a first cam and a second cam. The first cam and the second cam are disposed under the support pedestal, and respectively connected to the first alignment pins and the second alignment pins. When the first cam and the second cam rotates relative to the support pedestal, the first cam and the second cam respectively drive the first alignment pins and the second alignment pins to displace/move relative to the support pedestal, and the first alignment pins and the second alignment pins respectively position the first substrate and the second substrate, such that the first substrate is aligned with the second substrate. Next, the aligned first substrate and the aligned second substrate are stacked and bonded. By using the alignment mechanism of the present disclosure, it can save cost of installing sensors on the support pedestal, and this can reduce time of aligning and detecting.

An objective of the present disclosure is to provide an alignment method of the bonding machine, and steps of the alignment method are illustrated as follows. The first substrate is placed on the support pedestal, and the first cam drives first alignment pins protruding from the support pedestal to displace/move, such that the first alignment pins push the first substrate disposed between the first alignment pins, and the positioning of the first substrate is completed. Next, the second substrate is placed on the first alignment pins, and the second cam drives second alignment pins protruding from the support pedestal to displace/move, such that the second alignment pins push the second substrate disposed between the second alignment pins, and the positioning of the second substrate is completed. After the second substrate is aligned with the first substrate, the first alignment pins are driven to descend, such that the first substrate and the second substrate are stacked, and the bonding of the first substrate and the second substrate is performed.

To achieve the above objective of the present disclosure, the present disclosure provides an alignment mechanism of a bonding machine, and the alignment mechanism comprises: a support pedestal, having a support surface, used to support a first substrate, wherein the support surface has a placement area; at least three first alignment pins, disposed around the placement area of the support surface, used to position the first substrate supported by the support pedestal and to support a second substrate, wherein the first alignment pins rise or descend relative to the support surface of the support pedestal 的 support surface; at least three second alignment pins, disposed around the placement area of the support surface, used to position the second substrate supported by the first alignment pins; a first cam, disposed under the support pedestal and connected to the first alignment pins, wherein when the first cam rotates relative to the support pedestal, the first cam drives the first alignment pins to displace to change a distance between the first alignment pins, so as to position the first substrate supported by the support pedestal; and a second cam, disposed under the support pedestal and connected to the second alignment pins, wherein when the second cam rotates relative to the support pedestal, the second cam drives the second alignment pins to displace to change a distance between the second alignment pins, so as to position the second substrate supported by the first alignment pins, thereby aligning the second substrate with the first substrate; thus, the first alignment pins descend relative to the support surface of the support pedestal, and the supported second substrate is placed on the first substrate.

The present disclosure provides an alignment method of a bonding machine, which comprises: placing a first substrate on a support surface of a support pedestal; rising at least three first alignment pins to protrude from the support surface of the support pedestal; rotating a first cam relative to the support pedestal and driving the at least three first alignment pins to displace, thereby positioning the first substrate on the support surface of the support pedestal; protrude; rotating a second cam relative to the support pedestal and driving at least three second alignment pins to displace, thereby positioning the second substrate supported by the first alignment pins, so that the second substrate is aligned with the first substrate; and descending the first alignment pins, and placing the supported second substrate on the first substrate.

The alignment mechanism of the bonding machine further comprises: at least three uplift pins, disposed on the support surface of the support pedestal, wherein the first alignment pins and the second alignment pins are disposed around the uplift pins, the uplift pins are used to receive and support the first substrate, and to rise or descend relative to the support surface of the support pedestal, so as to place the supported first substrate on the support surface of the support pedestal.

Regarding the alignment mechanism of the bonding machine, the first cam and the second cam are stacked and connected to a shaft.

Regarding the alignment mechanism of the bonding machine, numbers of the first alignment pins and the second alignment pins are three, and angles of action of the first cam and the second cam are 120 degrees.

The alignment mechanism of the bonding machine further comprises: a lift unit, connected to the first alignment pins, used to drive the first alignment pins to rise or descend relative to the support surface of the support pedestal.

The alignment mechanism of the bonding machine further comprises: at least three first driven parts, connected to the first cam; and at least three second driven parts, connected to the second cam; wherein the first alignment pins and second alignment pins are respectively disposed on the first driven part and the second driven part.

Regarding the alignment mechanism of the bonding machine, wherein each of the first driven part and the second driven part comprises a restore unit, a slide base and a slide table, the slide table is set on the slide base, one end of the slide table is connected to the first cam or the second cam, and the other one end of the slide table is connected to the restore unit, and the first alignment pins or the second alignment pins are set on the slide table.

The alignment mechanism of the bonding machine further comprises: rollers, connected to the slide table and attached to the first cam or the second cam.

The alignment method of the bonding machine further comprises: rising at least three uplift pins to protrude from the support surface of the support pedestal, and supporting the first substrate; and rising at least three uplift pins to protrude from the support surface of the support pedestal, and supporting the first substrate.

DESCRIPTION OF THE EXEMPLARY EMBODIMENTS

Figure 1:
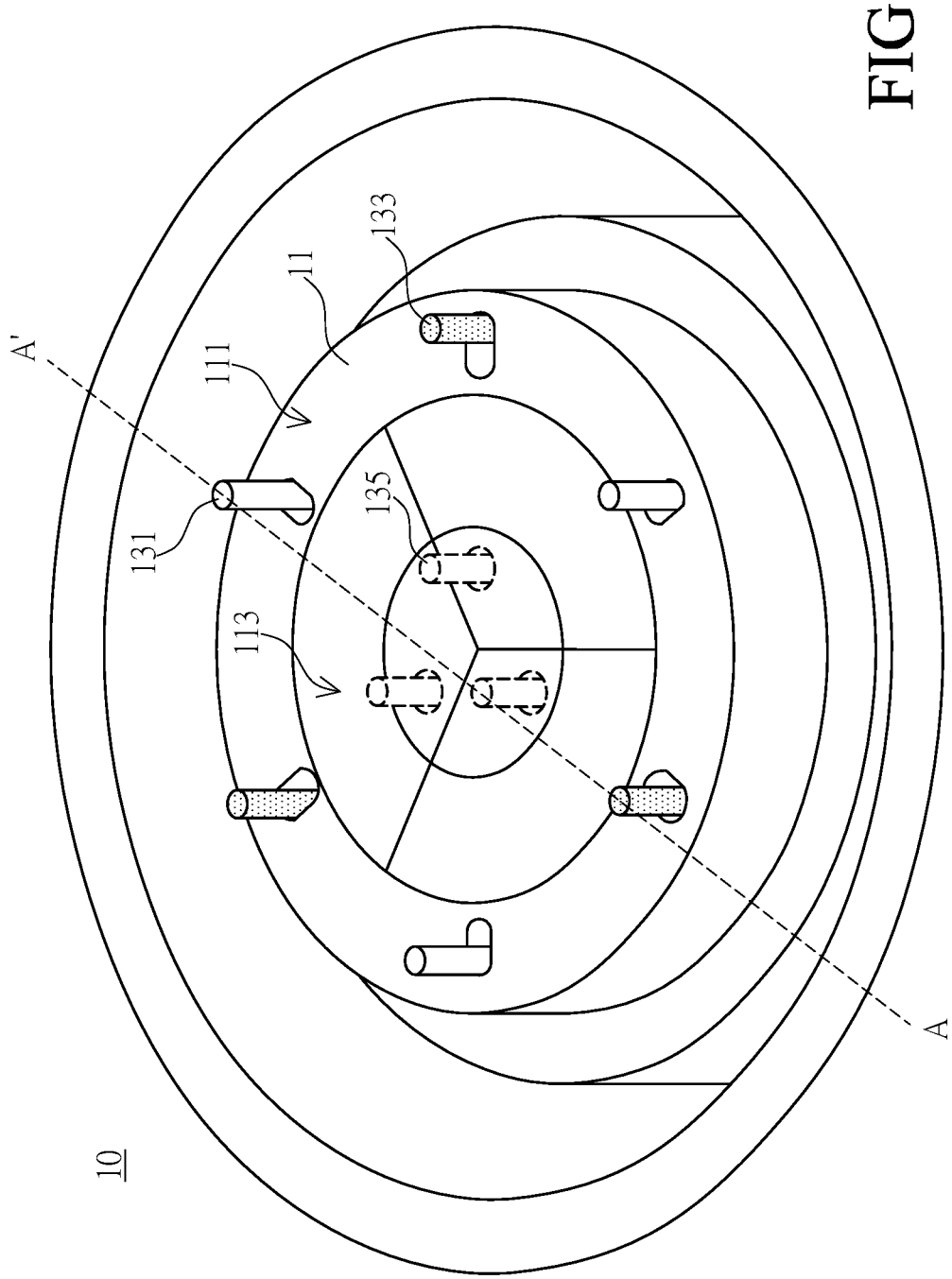
FIG. 1 is a three-dimensional schematic diagram of an alignment mechanism of a bonding machine according to one embodiment of the present disclosure.
Figure 2:
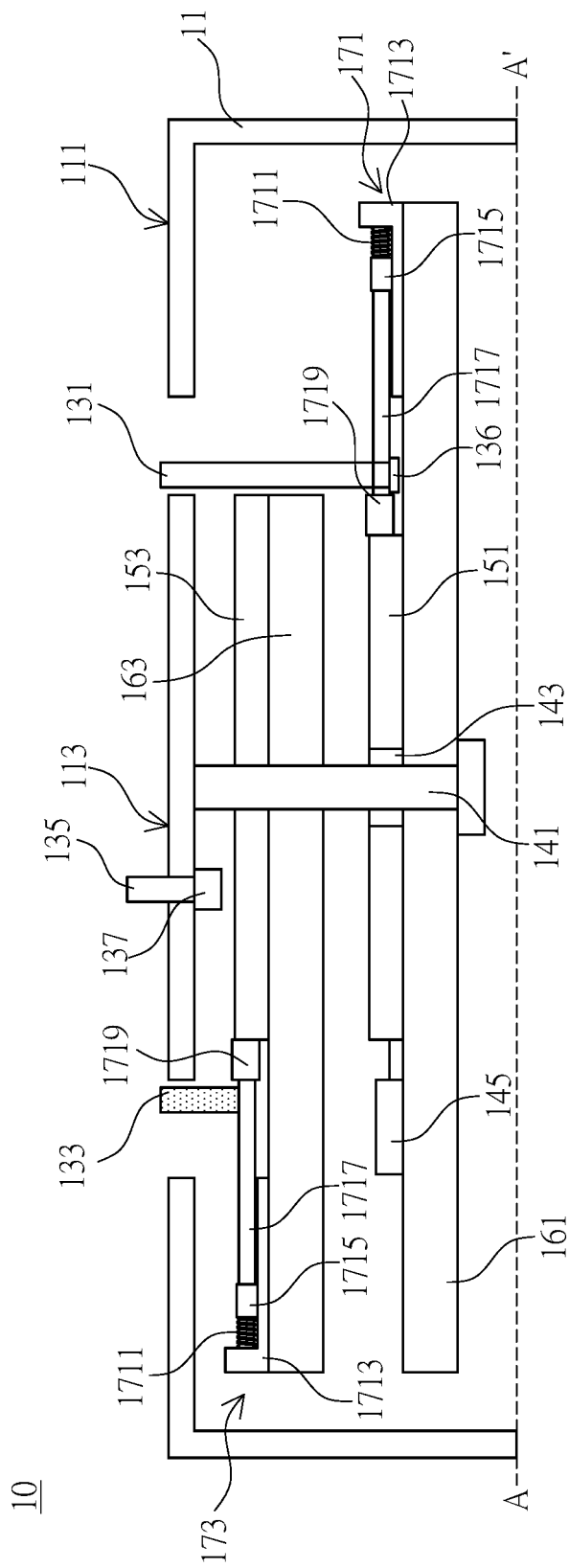
FIG. 2 is a sectional view of an alignment mechanism of a bonding machine according to an embodiment of the present disclosure.

Refer to FIG. 1 and FIG. 2, FIG. 1 is a three-dimensional schematic diagram of an alignment mechanism of a bonding machine according to one embodiment of the present disclosure, and FIG. 2 is a sectional view of an alignment mechanism of a bonding machine according to an embodiment of the present disclosure. As shown in the drawings, The alignment mechanism of the bonding machine 10 mainly includes a support pedestal 11, at least three first alignment pins 131, at least three second alignment pins 133, a first cam 151 and a second cam 153, wherein the first alignment pins 131 and the second alignment pins 133 are disposed within an area near an edge or periphery of the support pedestal 11. For example, a placement area 113 is defined on a support surface 111 of the support pedestal 11, and the first alignment pins 131 and the second alignment pins 133 are arranged at intervals. As shown in FIG. 1, the cross-sectional components have the second alignment pins 133, and the second alignment pins 133 are arranged around the placement area 113.

Figure 6:
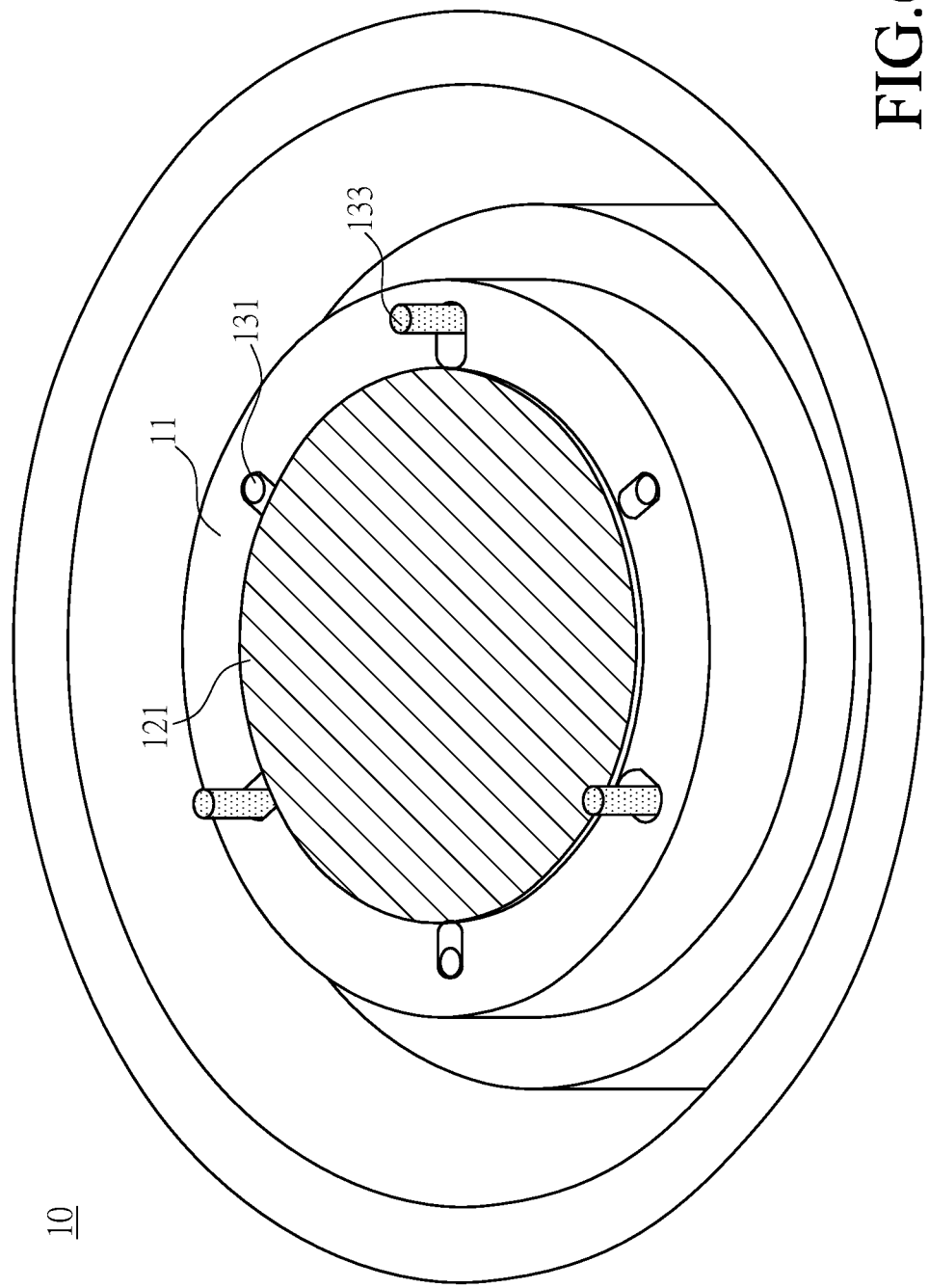
Figure 7:
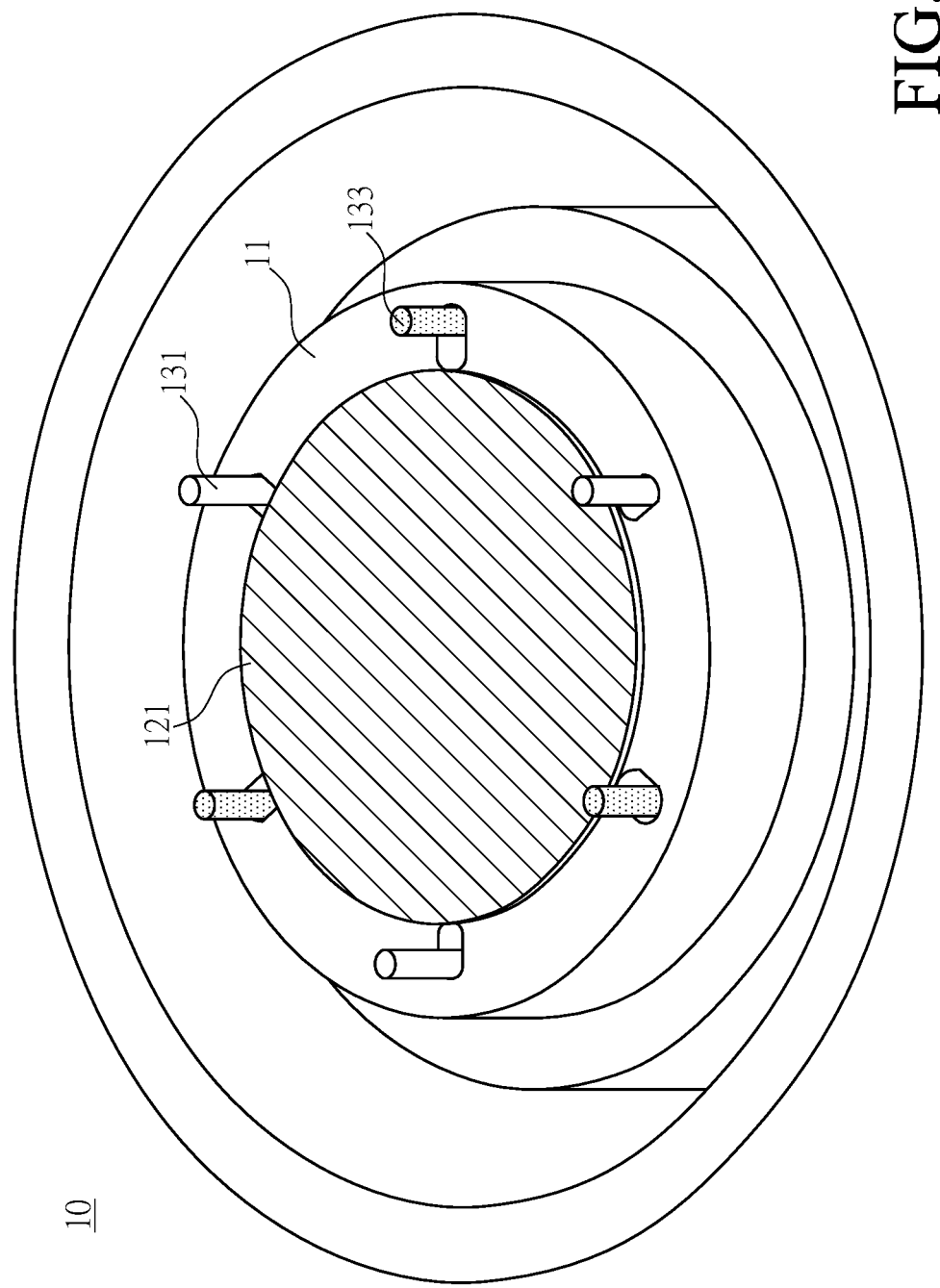
Figure 8:
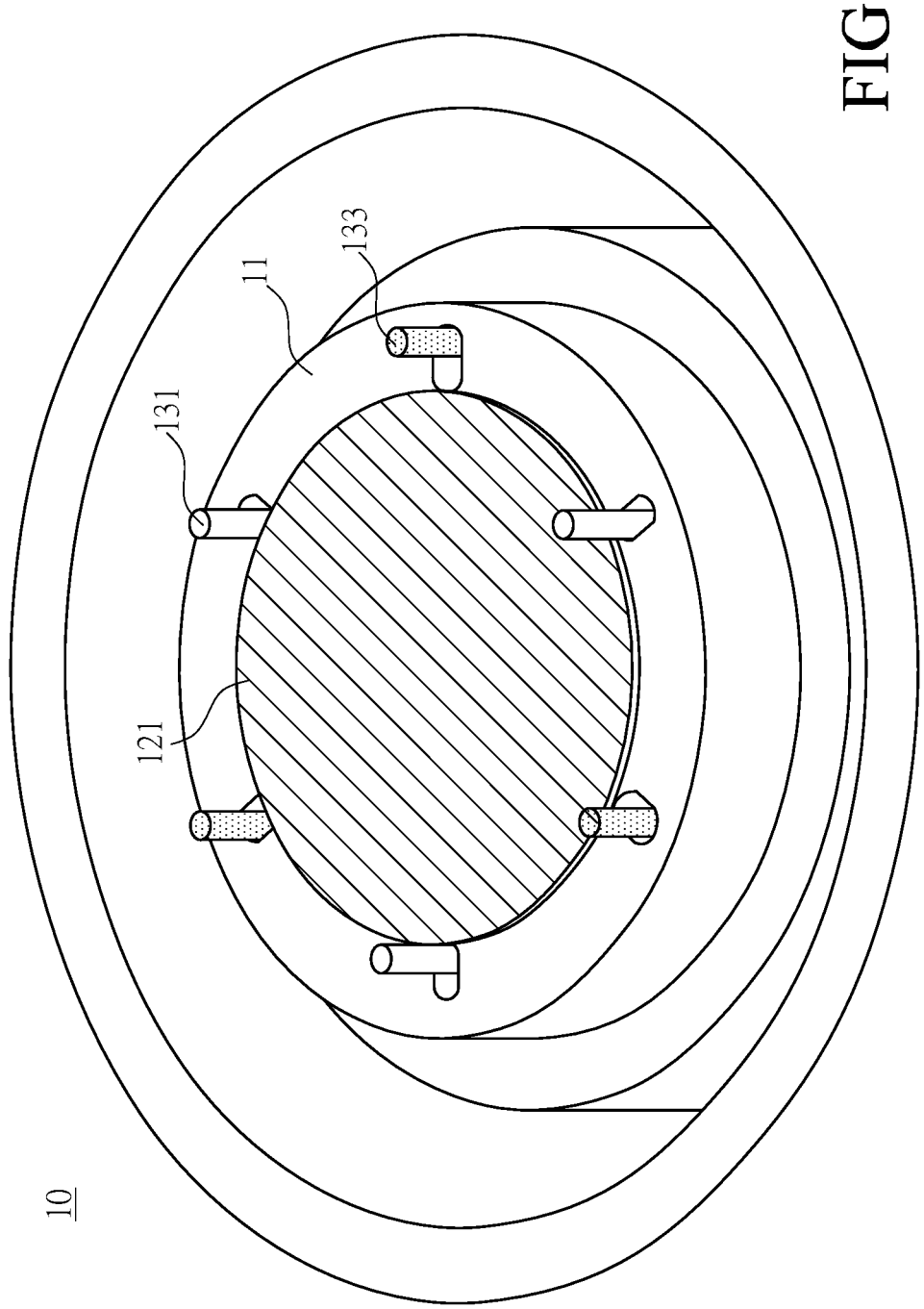
Figure 10:
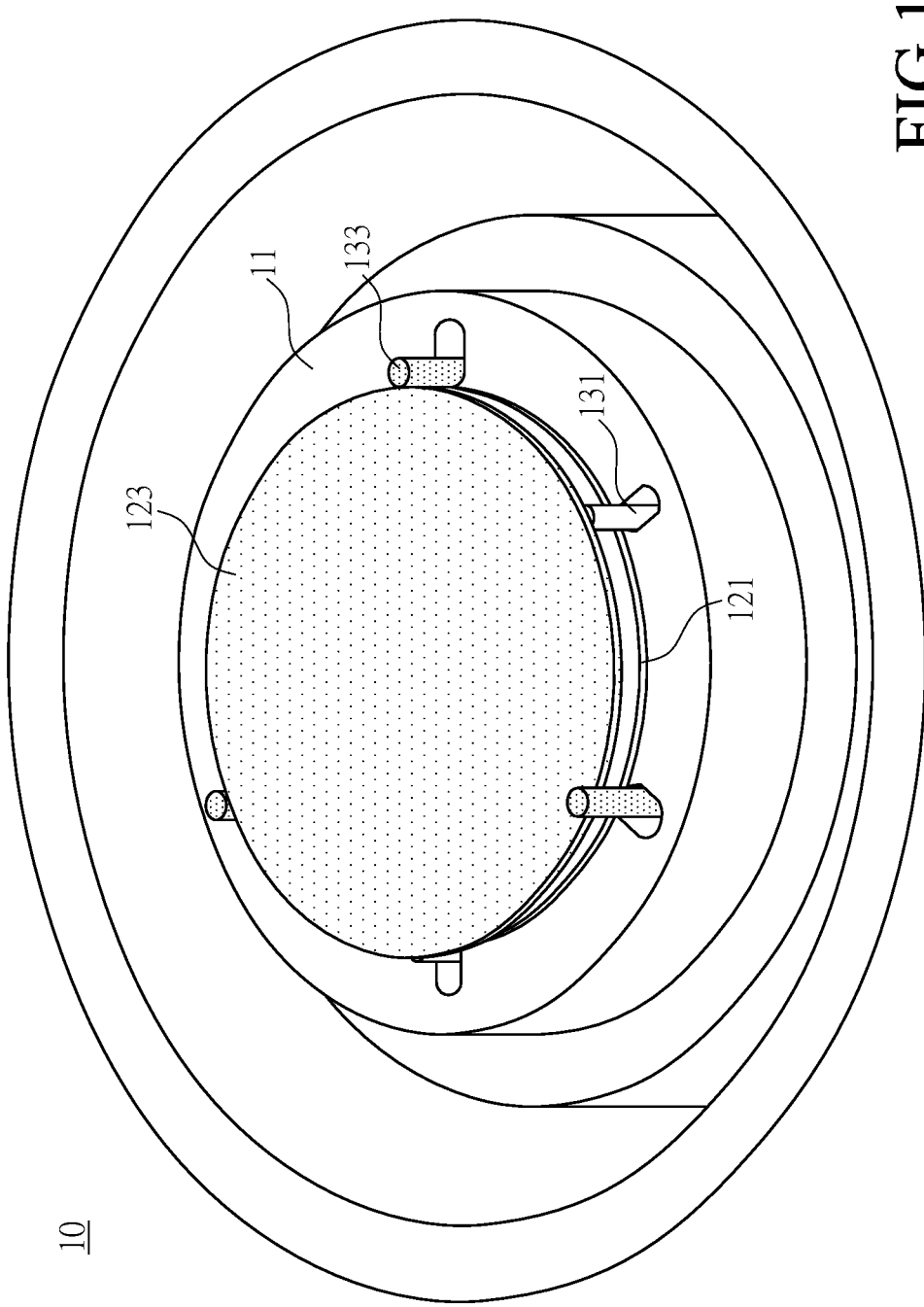
Figure 11:
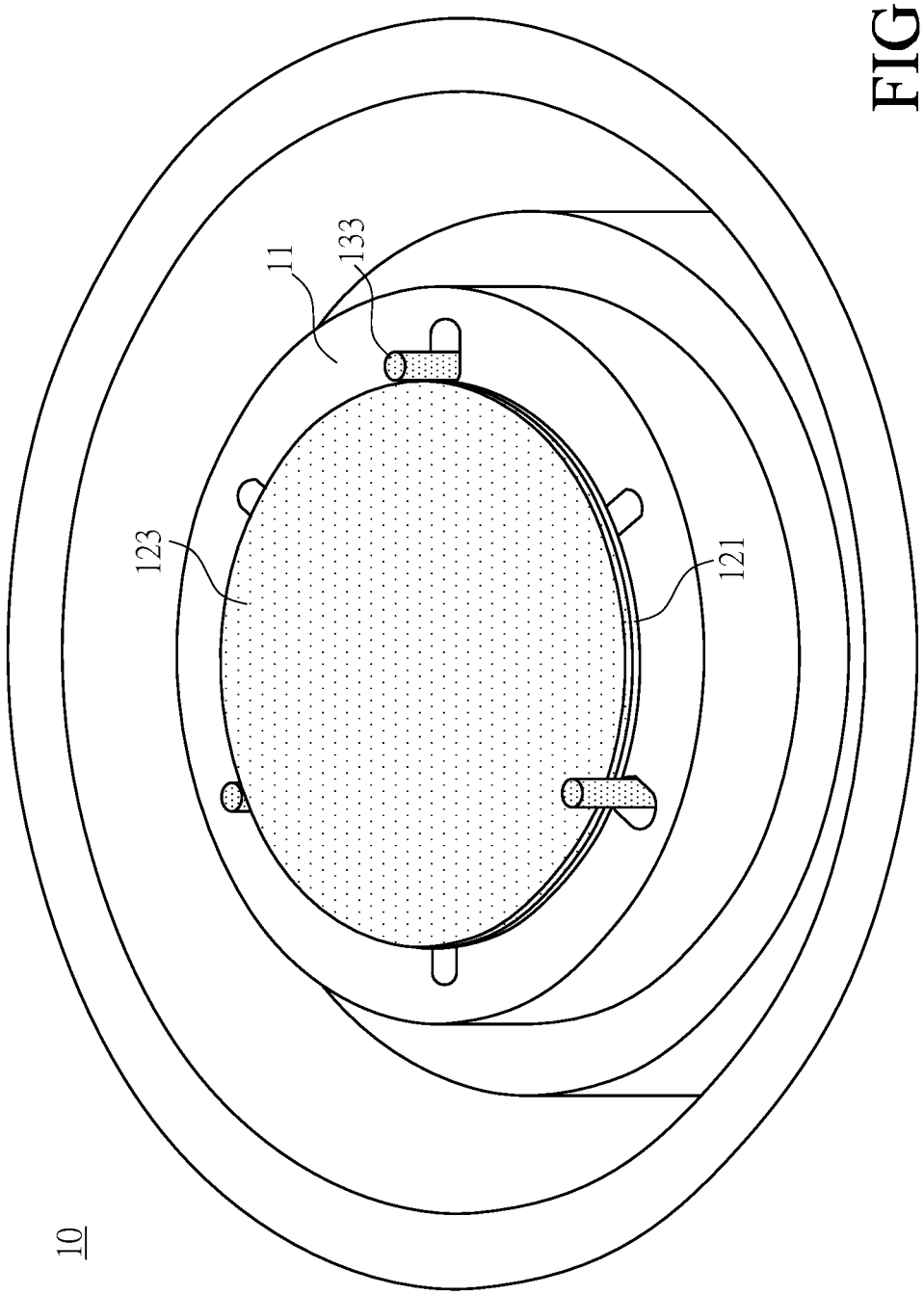

The support surface 111 of the support pedestal 11 can be used to support a first substrate 121, as shown in FIG. 6 to FIG. 8, wherein the first alignment pins 131 are disposed within the support surface 111 of the support pedestal 11, and can displace/move along a direction parallel to the support pedestal 11, so as to position the first substrate 121 placed on the support surface 111 of the support pedestal 11. In addition, the first alignment pins 131 can also be used to support the second substrate 123. The second alignment pins 133 are also disposed on the support surface 111 of the support pedestal 11, and can displace/move along the direction parallel to the support surface 111, so as to position the second substrate 123 supported by the first alignment pins 131, as shown in FIGS. 10-11. For example, the support surface 111 can be circular, and the first alignment pins 131 and the second alignment pins 133 can displace/move along a radial direction of the support surface 111.

The first cam 151 and the second cam 153 are disposed under the support pedestal 11. The first cam 151 is connected to the first alignment pins 131, and the second cam 153 is connected to the second alignment pins 133. The first cam 151 of the present disclosure is used to drive the first alignment pins 131 to move relative to the support pedestal 11, and the second cam 153 is used to drive the second alignment pins 133 to move relative to the support pedestal 11. In practice, regardless of whether the first cam 151 and the second cam 153 are directly connected or indirectly connected to the first alignment pins 131 and the second alignment pins 133, the effect of driving the first alignment pins 131 and the second alignment pins 133 can be achieved.

The first cam 151 and the second cam 153 may be disc cams, wherein the first cam 151 and the second cam 153 are stacked and rotate along the same axis. For example, the first cam 151 and the second cam 153 can be connected to the same shaft 141. When the shaft 141 rotates, it only drives one of the cams to rotate, while the other cam does not rotate with it. The rotation of the first cam 151 and the second cam 153 are independent.

In an embodiment of the present disclosure, a first fixing frame 161 and a second fixing frame 163 may be arranged under the support pedestal 11, wherein the first fixing frame 161 and the second fixing frame 163 are stacked. The first cam 151 and the first driven part 171 are set on the first fixing frame 161, and the second cam 153 and the second driven part 173 are set on the second fixing frame 163.

When the shaft 141 rotates, it will drive the second cam 153 to rotate, but will not drive the first cam 151 to rotate. The first cam 151 can be connected to a driver device 145, and the first cam 151 is driven to rotate via the driver device 145. When the driver device 145 drives the first cam 151 to rotate, the rotating first cam 151 will not drive the shaft 141 and the second cam 153 to rotate. For example, shaft 141 can be directly connected to second cam 153, and a bearing 143 can be connected to first cam 151. In different one embodiment, the first cam 151 and the second cam 153 can also be connected to different shafts, and the first cam 151 and the second cam 153 are driven to rotate via the different shafts.

The alignment mechanism of the bonding machine 10 of the present disclosure includes at least three first driven parts 171 and at least three second driven parts 173, each of the first alignment pins 131 is provided on the first driven part 171, and each of the second alignment pins 133 is provided on the second driven part 173. The first cam 151 is connected to the first driven part 171. When the first cam 151 rotates relative to the support pedestal 11, it will drive the first driven part 171 and the first alignment pins 131 to move relative to the support pedestal 11, and change the distance between the first alignment pins 131, so as to position the first substrate 121. The second cam 153 is connected to the second driven part 173. When the second cam 153 rotates relative to the support pedestal 11, it will drive the second driven part 173 and the second alignment pins 133 to move relative to the support pedestal 11, and change the distance between the second alignment pins 133, so as to position the second substrate 123.

In an embodiment of the present disclosure, the first driven part 171 and the second driven part 173 are the same or similar in structure, and each includes a restore unit 1711, a slide base 1713 and a slide table 1715, wherein the slide base 1713 can be fixed on the first fixing frame 161 or on the second fixing frame 163, the slide table 1715 is set on the slide base 1713 and can displace relative to the slide base 1713, for example, displace along the slide rails on the slide base 1713. The first alignment pins 131 and the second alignment pins 133 are arranged on different slide tables 1715, and move with the slide table 1715 relative to the slide base 1713.

One end of the slide table 1715 is connected to the first cam 151 or the second cam 153, and the other end is connected to the restore unit 1711. For example, a roller 1719 can be set at one end of the slide table 1715, wherein the roller 1719 is attached to the first cam 151 or the second cam 153 surface. The restore unit 1711 may be a spring, wherein the restoring force generated by the restore unit 1711 pushes the slide table 1715 to the first cam 151 or the second cam 153, so that the slide table 1715 is attached to the surface of the first cam 151 or the second cam 153.

The slide table 1715 can be connected to a connecting rod 1717, wherein the other end of the connecting rod 1717 can directly contact the first cam 151 or the second cam 153, for example, the end of the connecting rod 1717 contacting the first cam 151 or the second cam 153 is a pointed driven part or a flat driven part. In addition, a roller 1719, such as a wheel, can be connected to the end of the connecting rod 1717 that is not connected to the slide table 1715, wherein the roller 1719 is set on the connecting rod 1717 to contact the first cam 151 or the second cam 153, for example, one end of the connecting rod 1717 contacting the first cam 151 or the second cam 153 is a roller driven part.

In an embodiment of the present disclosure, the first alignment pins 131 can not only displace along the direction parallel to the support surface 111 of the support pedestal 11, but also extend and contract along the direction perpendicular to the support surface 111. For example, the first alignment pins 131 can be connected to a lift unit 136, and the lift unit 136 drives the first alignment pins 131 to rise or descend relative to the support surface 111 of the support pedestal 11. In addition, the first alignment pins 131 can descend synchronously or asynchronously. When the first alignment pins 131 descend synchronously, the second substrate 123 will be placed on the first substrate 121. When the first alignment pins 131 descend asynchronously, for example, the first alignment pin 131 of the left side descends and the first alignment pin 131 on the right side remains unchanged, the second substrate 123 is obliquely placed on the first substrate 121. The second alignment pins 133 can only displace along the direction parallel to the support surface 111 of the support pedestal 11, and cannot rise or descend relative to the support surface 111 of the support pedestal 11. Of course, the configuration that the second alignment pins 133 cannot rise and descend relative to the support pedestal 11 is only an embodiment of the present disclosure, and it is not a scope limitation of the present disclosure. In different one embodiment, the second alignment pins 133 can also be designed to be able to rise or descend relative to the support surface 11 of the support pedestal 11.

Figure 3:
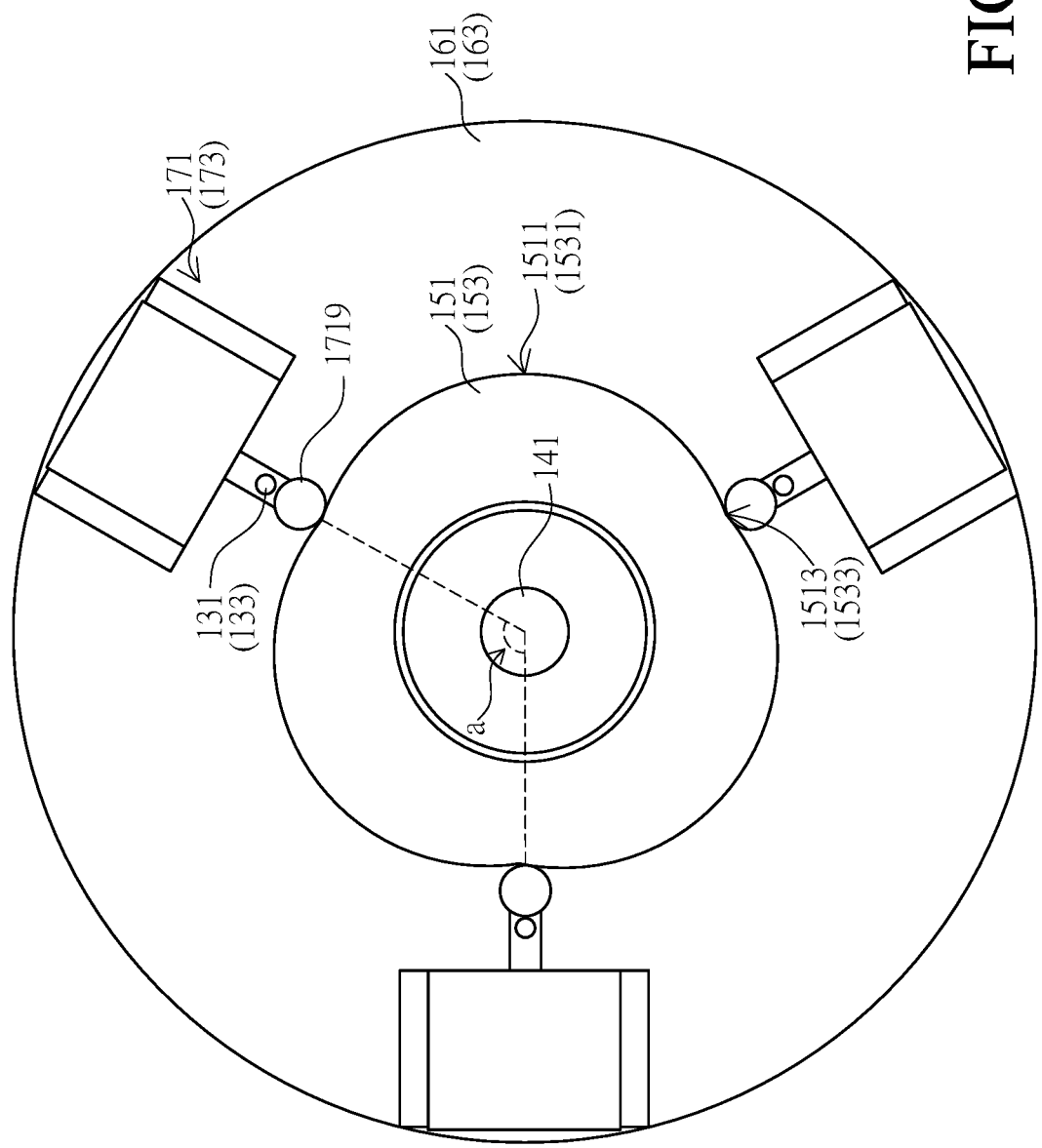
FIG. 3 is a top view showing cams, alignment pins and driven parts of an alignment mechanism of bonding machine in an alignment state according to an embodiment of the present disclosure.
Figure 4:
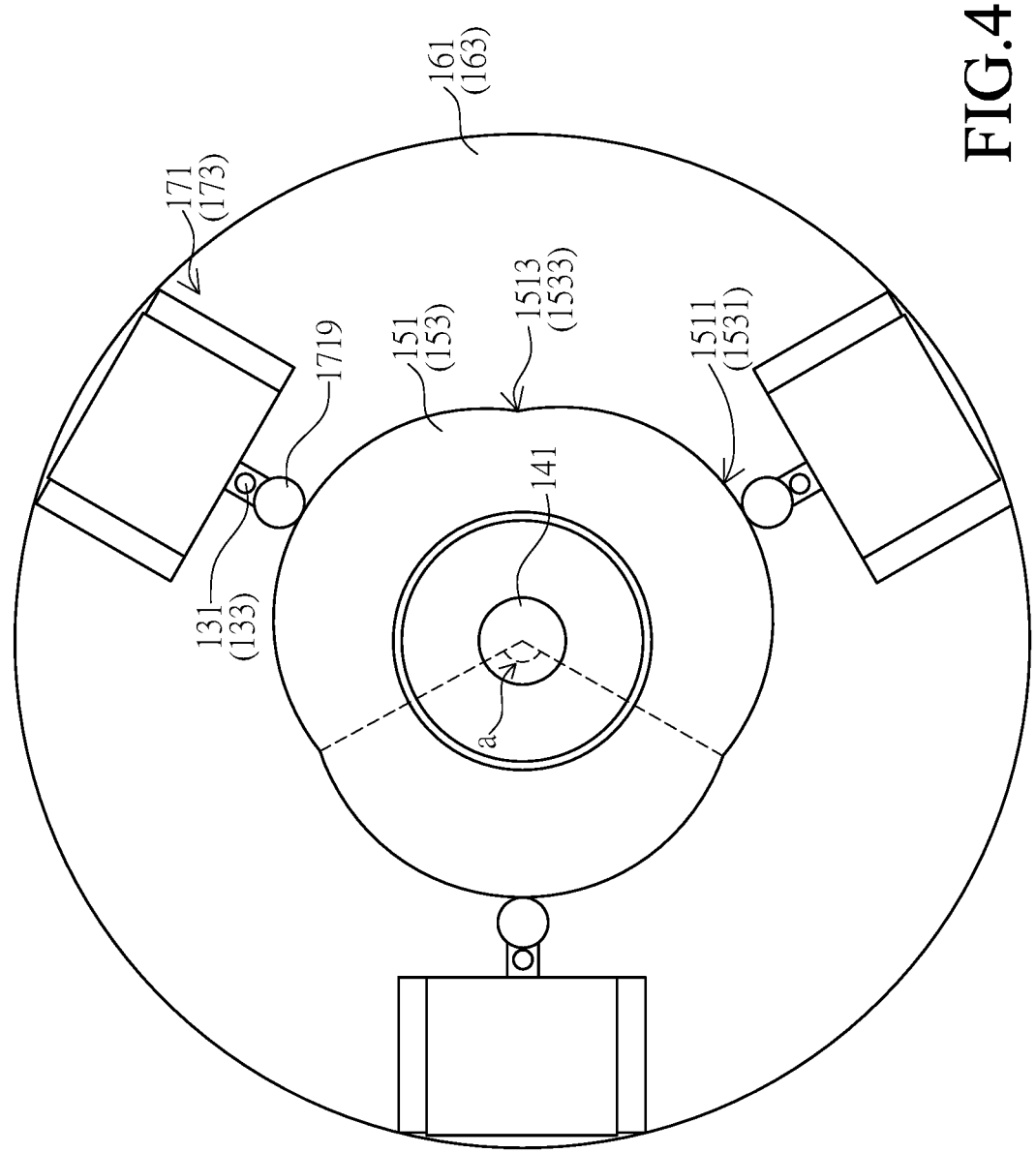
FIG. 4 is a top view showing cams, alignment pins and driven parts of an alignment mechanism of bonding machine in an open state according to an embodiment of the present disclosure.

In one embodiment of the present disclosure, as shown in FIG. 3 and FIG. 4, the numbers of the first alignment pins 131 and the second alignment pins 133 can be three, the action angles a of the first cam 151 and the second cam 153 can be 120 degrees, and the angles between the adjacent first alignment pins 131 and between the adjacent second alignment pins 133 are also 120 degrees. Specifically, the action angle 120 degree is interpreted as each cam surface corresponding with a roller are 120 degrees apart. The first cam 151 includes three concaves 1513 and three convexes 1511, and the second cam 153 also includes three concaves 1533 and three convexes 1531. The distance between the concave 1511/1531 and the center of the first or second cam 151/153, or the distance between the concave 1511/1531 and the shaft 141, is greater than the distance between the convex 1513/1533 and the center of the first or second cam 151/153, or the distance between the convex 1511/1533 and the shaft 141. The numbers of the first alignment pins 131 and the second alignment pins 133 are three, and the configuration that angles a of action of the first cam 151 and the second cam 153 of 120 degrees is only an embodiment of the present disclosure, and it is not a scope limitation of the present disclosure.

The alignment mechanism of the bonding machine 10 positions the first substrate 121 and the second substrate 123 on the support pedestal 11 via the first alignment pins 131 and the second alignment pins 133, respectively, wherein the first substrate 121 and the second substrate 123 are overlapped.

When the first cam 151 rotates relative to the support pedestal 11, the first driven part 171 will sequentially contact the convex 1511 and the concave 1513 of the first cam 151. When the first driven part 171 contacts the convex 1511 of the first cam 151, the restore unit 1711 will be compressed, as shown in FIG. 4, so that the slide table 1715 and the first alignment pins 131 displace toward the outer edge of the support pedestal 11 and away from the placement area 113 of the support pedestal 11, thereby increasing the distances between the first alignment pins 131. When the distance between the first alignment pins 131 is the largest, it can be defined as an open state, and the first substrate 121 can be placed in the placement area 113 between the first alignment pins 131.

When the first driven part 171 contacts the concave 1513 of the first cam 151, the restore unit 1711 will extend, as shown in FIG. 3, so that the slide table 1715 and the first alignment pins 131 displace toward the center of the support pedestal 11 and are close to the placement area 113 of the support pedestal 11 to reduce the distance between the first alignment pins 131. When the distance between the first alignment pins 131 is the smallest, it can be defined as an alignment state, and the first substrate 121 placed between the first alignment pins 131 can be positioned via the first alignment pins 131.

In addition, when the second cam 153 rotates, the second driven part 173 will sequentially contact the convex 1531 and the concave 1533 of the second cam 153. When the second driven part 173 contacts the convex 1531 of the second cam 153, the restore unit 1711 will be compressed, as shown in FIG. 4, and the slide table 1715 and the second alignment pins 133 displace toward the outer edge of the support pedestal 11 to increase the distance between the second alignment pins 133. When the distance between the second alignment pins 133 is the largest, it can be defined as an open state, and the second substrate 123 can be placed in the placement area 113 between the second alignment pins 133.

When the second driven part 173 contacts the concave 1533 of the second cam 153, the restore unit 1711 will extend, as shown in FIG. 3, so that the slide table 1715 and the second alignment pins 133 displace toward the center of the support pedestal 11 to reduce the distance between the second alignment pins 133. When the distance between the second alignment pins 133 is the smallest, it can be defined as an alignment state, and the second substrate 123 placed between the second alignment pins 133 can be positioned.

The smallest distance between the first alignment pins 131 and the smallest distance between the second alignment pins 133 can be adjusted according to the sizes of the first substrate 121 and the second substrate 123, respectively. Specifically, the first substrate 121 and the second substrate 123 are disc-shaped, wherein the circle formed by the first alignment pins 131 in the alignment state has a size similar to the size of the first substrate 121, and the circle formed by the second alignment pins 133 in the alignment state has a size similar to the size of the second substrate 123.

In an embodiment of the present disclosure, the alignment mechanism of the bonding machine 10 may include at least three uplift pins 135 arranged on the support surface 111 of the support pedestal 11, wherein the first alignment pins 131 and the second alignment pins 133 are arranged around the uplift pins 135, for example, the uplift pins 135 can be set within the placement area 113 of the support pedestal 11. The uplift pins 135 can rise and descend vertically and relative to the support surface 111 of the support pedestal 11. For example, the uplift pins 135 can be connected to a lift unit 137, the lift unit 137 drives the uplift pin 135 to rise or descend relative to the support surface 111 of the support pedestal 11. When the uplift pin 135 rises, it can be used to receive and support the first substrate 121; and when the uplift pin 135 descends, the supported first substrate 121 can be placed on the support surface 111 of the support pedestal 11. In addition, the uplift pins 135 can descend synchronously or asynchronously, and the first substrate 121 is placed on the support surface 111 of the support pedestal 11 in a flat or inclined manner (i.e. placed flatly or obliquely). The uplift pins 135 are not essential components of the present disclosure. In different one embodiment, the first substrate 121 can also be directly placed in the placement area 113 of the support pedestal 11.

Figure 5:
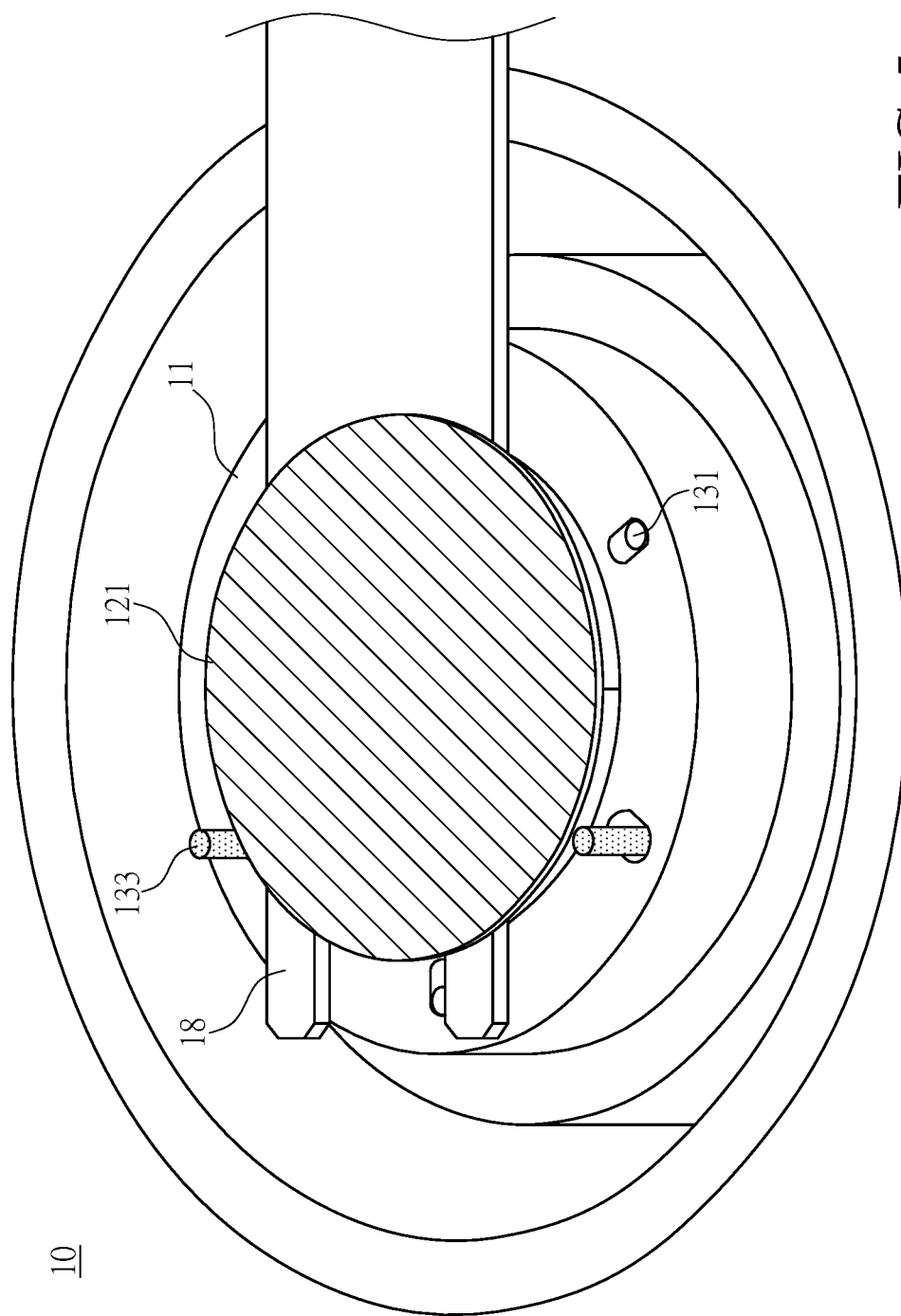
FIG. 5 through FIG. 11 are schematic diagrams respectively showing steps of an alignment method of a bonding machine according to one embodiment of the present disclosure.

Refer to FIG. 5-FIG. 11, FIG. 5-FIG. 11 are schematic diagrams respectively showing steps of an alignment method of a bonding machine according to one embodiment of the present disclosure. Firstly, the first substrate 121 is transferred to the support pedestal 11, as shown in FIG. 5. In an embodiment of the present disclosure, please refer to FIG. 1, at least three uplift pins 135 rise to protrude from the support surface 111 of the support pedestal 11, and the first substrate 121 is placed on the uplift pins 135 protruding from the support surface 111 by using a robot 18. The uplift pins 135 can descend relative to the support surface 111, and the supported first substrate 121 is placed on the support surface 111 of the support pedestal 11, as shown in FIG. 6.

In another embodiment of the present disclosure, the robot 18 can adsorb the upper surface of the first substrate 121, and directly place the first substrate 121 in the placement area 113 of the support surface 111 of the support pedestal 11. In this way, no lift pins 135 are required. In addition, when the first substrate 121 is placed on the uplift pins 135 and/or the support pedestal 11, the second alignment pins 133 protrude from the support surface 111 of the support pedestal 11 and operate in the open state. For example, the convex 1531 of the second cam 153 contacts the second driven part 173, so that the second alignment pins 133 protruding from the support surface 111 of the support pedestal 11 operates in the open state.

After the first substrate 121 is placed on the support surface 111 of the support pedestal 11, the first alignment pins 131 rise and protrude from the support surface 111 of the support pedestal 11, as shown in FIG. 7. At this time, the convex 1511 of the first cam 151 contacts the first driven part 171, so that the first alignment pins 131 protruding from the support surface 111 of the support pedestal 11 operates in the open state, and the distance between the first alignment pins 131 can be the largest, as shown in FIG. 2 and FIG. 4.

The first cam 151 rotates relative to the support pedestal 11 and drives the first alignment pins 131 to displace, so that the first alignment pins 131 of the support surface 111 protruding from the support pedestal 11 operate in the alignment state, as shown in FIG. 2 and FIG. 3. The first alignment pins 131 in the aligned state form a circle with a size and shape similar to the size and shape of the first substrate 121, and the first alignment pins 131 position the first substrate 121 supported by the support pedestal 11 when switching to the alignment state from the open state.

Figure 9:
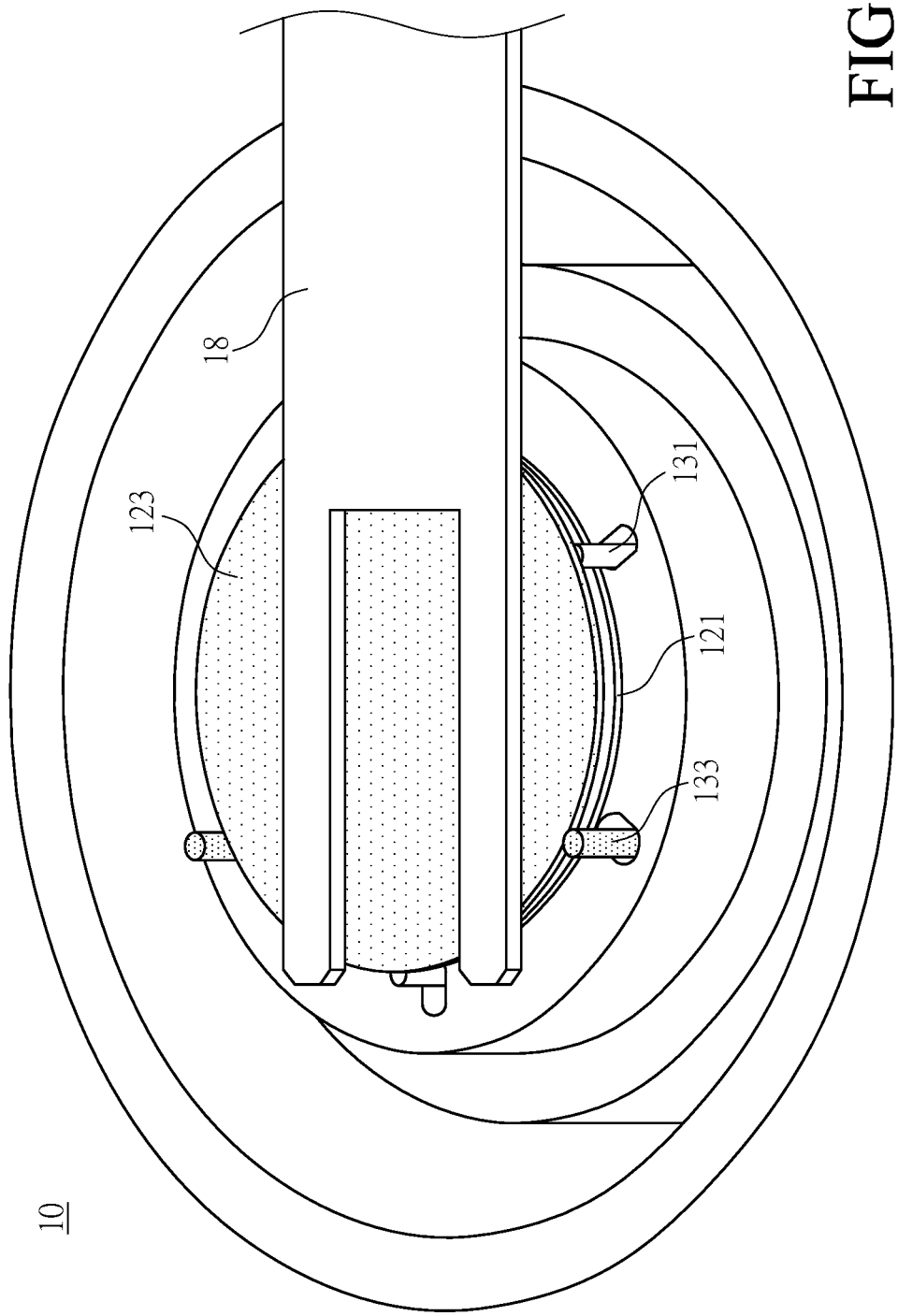

After the positioning of the first substrate 121 is completed, the upper surface of the second substrate 123 can be adsorbed by the robot 18, and the second substrate 123 can be transferred to the support pedestal 11, as shown in FIG. 9. Specifically, the robot 18 can place the second substrate 123 on the first alignment pins 131, and use the first alignment pins 131 to support the second substrate 123, and the second alignment pins 133 operate in the open state. At this time, the second substrate 123 does not contact the first substrate 121, and there is a gap between the first substrate 121 and the second substrate 123.

The second cam 153 rotates relative to the support pedestal 11, and drives the second alignment pins 133 to displace, so that the second alignment pins 133 protruding from the support surface 111 operate in the alignment state, as shown in FIG. 10, FIG. 2 and FIG. 3. The second alignment pins 133 in the alignment state form a circle with a size and shape similar to those of the second substrate 123, and the second alignment pins 133 then position the second substrate 123 supported by the first alignment pins 131 when switching to alignment state from the open state.

After the positioning of the second substrate 123 is completed, the second substrate 123 will be aligned with the first substrate 121, the first alignment pins 131 then descend relative to the support surface 111 of the support pedestal 11, and the supported second substrate 123 is placed on the first substrate 121. Therefore, the alignment of the first substrate 121 and the second substrate 123 is completed, and the bonding of the first substrate 121 and the second substrate 123 is then performed, as shown in FIG. 11.

In an embodiment of the present disclosure, the first substrate 121 includes a wafer or a chip, and the second substrate 123 includes a sapphire carrier substrate. However, the present disclosure does not limit types of the first substrate 121 and the second substrate 123.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. An alignment mechanism of a bonding machine, comprising:
    a support pedestal, having a support surface, used to support a first substrate, wherein the support surface has a placement area;
    at least three first alignment pins, disposed around the placement area of the support surface, used to position the first substrate supported by the support pedestal and to support a second substrate;
    at least three second alignment pins, disposed around the placement area of the support surface, used to position the second substrate supported by the first alignment pins;
    a first cam, disposed under the support pedestal and connected to the first alignment pins, wherein when the first cam rotates relative to the support pedestal, the first cam drives the first alignment pins to change a distance between the first alignment pins, so as to position the first substrate supported by the support pedestal;
    a second cam, disposed under the support pedestal and connected to the second alignment pins, wherein when the second cam rotates relative to the support pedestal, the second cam drives the second alignment pins to change a distance between the second alignment pins, so as to position the second substrate supported by the first alignment pins, thereby aligning the second substrate with the first substrate;
    at least three uplift pins, disposed on the support surface of the support pedestal, wherein the first alignment pins and the second alignment pins are disposed around the uplift pins, the uplift pins are used to receive and support the first substrate, and to rise or descend relative to the support surface of the support pedestal, so as to place the first substrate supported on the support surface of the support pedestal; and
    at least three lift units, respectively connected to the at least three uplift pins, used to drive the at least three uplift pins to descend in an asynchronous manner, so that the first substrate is obliquely placed on the support surface of the support pedestal.

2. The alignment mechanism of the bonding machine of claim 1, further comprising:
    a robot, used to place the first substrate on the uplift pins.

3. The alignment mechanism of the bonding machine of claim 1, wherein the first cam and the second cam are stacked and rotated along an axis.

4. The alignment mechanism of the bonding machine of claim 1, wherein the plurality of the first alignment pins and the plurality of the second alignment pins consist of three, respectively, and action angles of the first cam and the second cam are 120 degrees, respectively.

5. The alignment mechanism of the bonding machine of claim 1, further comprising:
    at least three first driven parts, connected to the first cam; and
    at least three second driven parts, connected to the second cam;
    wherein the first alignment pins and second alignment pins are respectively disposed on the first driven part and the second driven part.

6. The alignment mechanism of the bonding machine of claim 5, wherein each of the first driven part and the second driven part comprises a restore unit, a slide base and a slide table, the slide table is set on the slide base, a first end of the slide table is connected to the first cam or the second cam, and a second end of the slide table is connected to the restore unit, and the first alignment pins or the second alignment pins are set on the slide table.

7. The alignment mechanism of the bonding machine of claim 6, further comprising:
    rollers, connected to the slide table and attached to the first cam or the second cam.

8. An alignment mechanism of a bonding machine, comprising:

a support pedestal, having a support surface, used to support a first substrate, wherein the support surface has a placement area;

at least three first alignment pins, disposed around the placement area of the support surface, used to position the first substrate supported by the support pedestal and to support a second substrate;

at least three second alignment pins, disposed around the placement area of the support surface, used to position the second substrate supported by the first alignment pins;

a first cam, disposed under the support pedestal and connected to the first alignment pins, wherein when the first cam rotates relative to the support pedestal, the first cam drives the first alignment pins to change a distance between the first alignment pins, so as to position the first substrate supported by the support pedestal;

a second cam, disposed under the support pedestal and connected to the second alignment pins, wherein when the second cam rotates relative to the support pedestal, the second cam drives the second alignment pins to change a distance between the second alignment pins, so as to position the second substrate supported by the first alignment pins, thereby aligning the second substrate with the first substrate; and at least one lift unit, connected to the first alignment pins, used to drive the first alignment pins to rise or descend relative to the support surface of the support pedestal, wherein the at least one lift unit comprises at least three of the lift units, respectively connected to the at least three first alignment pins, used to drive the at least three first alignment pins to descend in an asynchronous manner, so that the second substrate is obliquely placed on the first substrate.

9. An alignment method of a bonding machine, comprising:

placing a first substrate on a support surface of a support pedestal;

rotating a first cam relative to the support pedestal and driving at least three first alignment pins to displace, thereby positioning the first substrate on the support surface of the support pedestal, wherein the at least three first alignment pins protrude from the support surface of the support pedestal;

supporting a second substrate by using the first alignment pins which protrude from the support surface of the support pedestal;

rotating a second cam relative to the support pedestal and driving at least three second alignment pins to displace, thereby positioning the second substrate supported by the first alignment pins, so that the second substrate is aligned with the first substrate; and descending the at least three first alignment pins in an asynchronous manner, and placing the second substrate obliquely on the first substrate.

10. The alignment method of the bonding machine of claim 9, further comprising:

after placing the first substrate on the support surface of the support pedestal, rising the at least three first alignment pins to protrude from the support surface of the support pedestal, wherein the first substrate is disposed between the at least three first alignment pins.

11. The alignment method of the bonding machine of claim 9, further comprising:

after the at least three first alignment pins rise and protrude from the support surface of the support pedestal, placing the first substrate on the support surface of the support pedestal, wherein the first substrate is disposed between the at least three first alignment pins.

12. The alignment method of the bonding machine of claim 9, further comprising:

rising at least three uplift pins to protrude from the support surface of the support pedestal, and supporting the first substrate; and descending at least three uplift pins, and placing the first substrate supported on the support surface of the support pedestal.

13. The alignment method of the bonding machine of claim 9, further comprising:

rising at least three uplift pins to protrude from the support surface of the support pedestal, and placing the first substrate; and descending the at least three uplift pins in an asynchronous manner, and placing the first substrate obliquely on the support surface of the support pedestal.

* * * * *